United States Patent
Kao et al.

(10) Patent No.: US 11,569,600 B1
(45) Date of Patent: Jan. 31, 2023

(54) CABLE CONNECTOR STRUCTURE

(71) Applicant: JESS-LINK PRODUCTS CO., LTD., New Taipei (TW)

(72) Inventors: Ya-Fen Kao, New Taipei (TW); Hsu-Feng Chang, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 13 days.

(21) Appl. No.: 17/471,125

(22) Filed: Sep. 9, 2021

(30) Foreign Application Priority Data

Jul. 19, 2021 (TW) .................................. 110126432

(51) Int. Cl.
| | | |
|---|---|---|
| *H01R 12/72* | (2011.01) | |
| *H05K 7/20* | (2006.01) | |
| *H01R 12/51* | (2011.01) | |
| *H01R 13/639* | (2006.01) | |
| *H01R 13/629* | (2006.01) | |
| *H01R 13/504* | (2006.01) | |

(52) U.S. Cl.
CPC .......... *H01R 12/725* (2013.01); *H01R 12/51* (2013.01); *H01R 13/5045* (2013.01); *H01R 13/629* (2013.01); *H01R 13/639* (2013.01); *H05K 7/2039* (2013.01)

(58) Field of Classification Search
CPC .. H01R 12/725; H01R 12/51; H01R 13/5045; H01R 13/629; H01R 13/639; H05K 7/2039
See application file for complete search history.

(56) References Cited

U.S. PATENT DOCUMENTS

| 10,104,760 | B1 * | 10/2018 | Briant ................ G02B 6/4284 |
| 11,073,336 | B2 * | 7/2021 | Chen ..................... F28D 1/0233 |
| 11,374,363 | B2 * | 6/2022 | Rita ................... H01R 13/6691 |
| 2021/0075161 | A1 * | 3/2021 | Qiao ................... H01R 12/771 |

FOREIGN PATENT DOCUMENTS

| CN | 107658642 A | 2/2018 |
| CN | 211184794 U | 8/2020 |
| TW | M573526 U | 1/2019 |
| TW | 202110007 A | 3/2021 |

OTHER PUBLICATIONS

Office Action dated Sep. 21, 2022 of the corresponding Taiwan patent application No. 110126432.

* cited by examiner

*Primary Examiner* — Travis S Chambers
(74) *Attorney, Agent, or Firm* — Chun-Ming Shih; HDLS IPR Services

(57) ABSTRACT

The present disclosure relates to a cable connector structure, which includes a housing, a tongue plate, a plurality of cables, and a plurality of heat sinks. The housing includes a docking end and a butting end. One side of the housing includes a top surface, and the top surface protrudingly provided with a hollow stage. The tongue plate is arranged in the housing, one end of the tongue plate is provided with a docking area, and the other end of the tongue plate is provided with a welding area. The plurality of heat sinks is arranged on the top surface of the housing, the hollow stage is arranged toward the docking end and the plurality of heat sinks are arranged toward the butting end.

10 Claims, 8 Drawing Sheets

CABLE CONNECTOR STRUCTURE

BACKGROUND

Technical Field

The present disclosure is related to a connector structure, in particular to a cable connector structure capable of accommodating multilayer cables and having desired heat dissipation efficiency.

Description of Related Art

Connectors are widely used in various fields, and various types of connectors are derived. A general cable connector connects a plurality of cables in at least one wire harness to a butting end of a tongue plate, so as to be connected to another mating connector to transmit signals.

However, with a rapid increase in data processing speed and capacity requirements, cables required by the cable connector also increase, so that each cable also needs more space to facilitate the connection with the tongue plate. As a transmission rate increases, a high temperature generated during operation also requires corresponding heat dissipation solution to effectively dissipate heat. Therefore, how to make the cable connector accommodate more cables and have desired heat dissipation performance under minimal space change is an important issue.

In view of the shortcomings of above related art, an inventor devoted themselves to research and cooperated with an application of theories, and tried their best to solve the shortcomings, which became a purpose of the inventor.

SUMMARY

A main purpose of the present disclosure is to enable a cable connector to accommodate more cables under minimal space change, and have desired heat dissipation efficiency at the same time.

In order to achieve the above purpose, the present disclosure provides a cable connector structure, which includes a housing, a tongue plate, a plurality of cables, and a plurality of heat sinks. The housing includes a docking end and a butting end. One side of the housing includes a top surface, and the top surface protrudingly provided with a hollow stage. The hollow stage is provided with a pair of through openings facing the docking end and the butting end respectively. The tongue plate is arranged in the housing, one end of the tongue plate is provided with a docking area, and the other end of the tongue plate is provided with a welding area. A position of the welding area corresponds to the hollow stage, and the docking area is exposed at the docking end. The plurality of cables is electrically connected to the welding area of the tongue plate. The plurality of heat sinks is arranged on the top surface of the housing, the hollow stage is arranged toward the docking end and the plurality of heat sinks are arranged toward the butting end.

The present disclosure also includes the following effects: The pair of through openings of the hollow stage provide a natural air convection. Each of the plurality of heat sinks strengthens a structural strength of the hollow stage and enhances the effect of the natural air convection. An upper crook and a lower crook fix an upper shell and a lower shell of the housing to prevent the upper shell and the lower shell from separating when pulled. the tongue plate is fixed between the upper shell and the lower shell through each supporting part and each convex block. Each protrusion and each recess of each heat sink and flow channels between the plurality of heat sinks may improve an overall heat dissipation effect.

DETAILED DESCRIPTION

Figure 1:
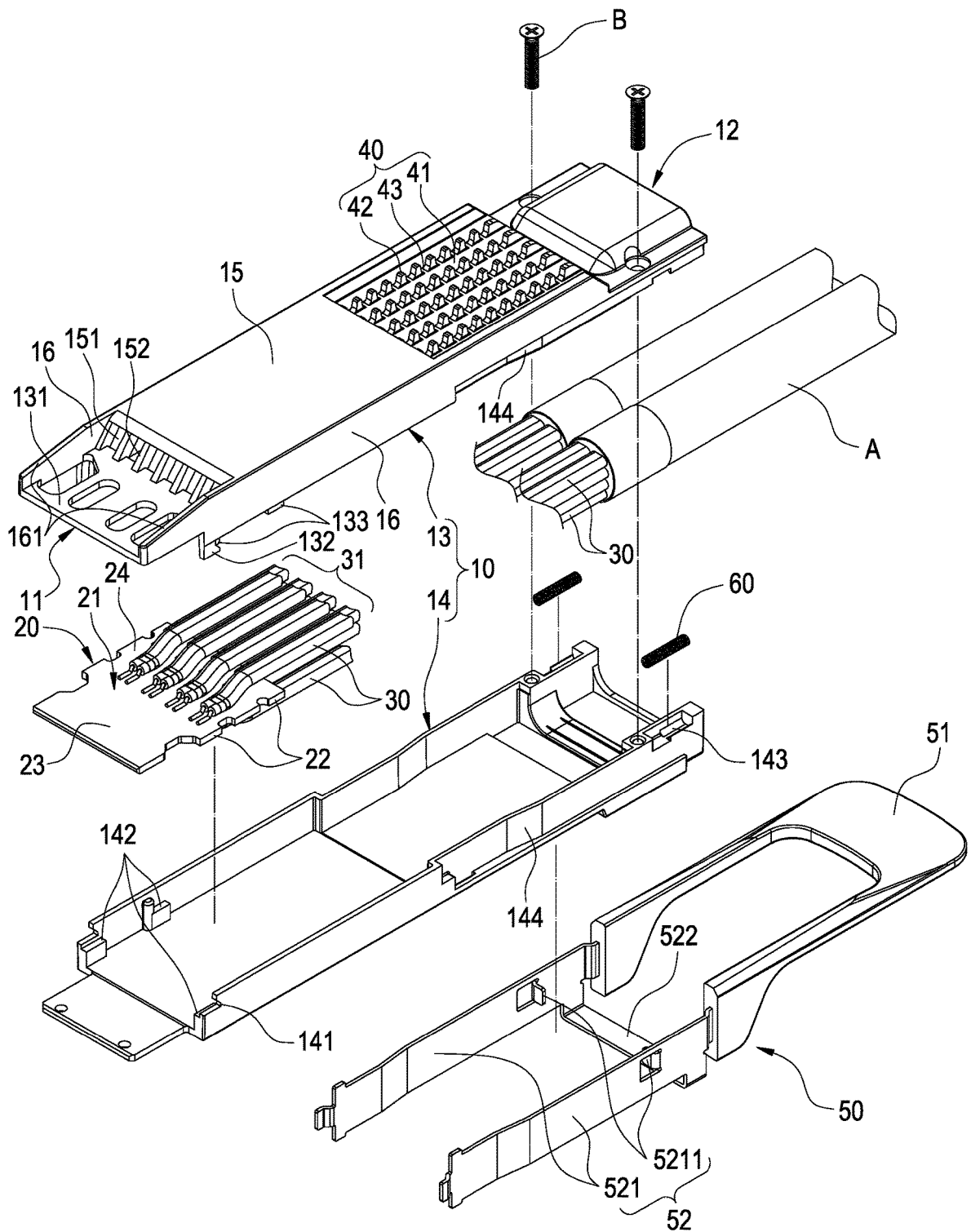
FIG. 1 is a perspective exploded diagram of the present disclosure.
Figure 2:
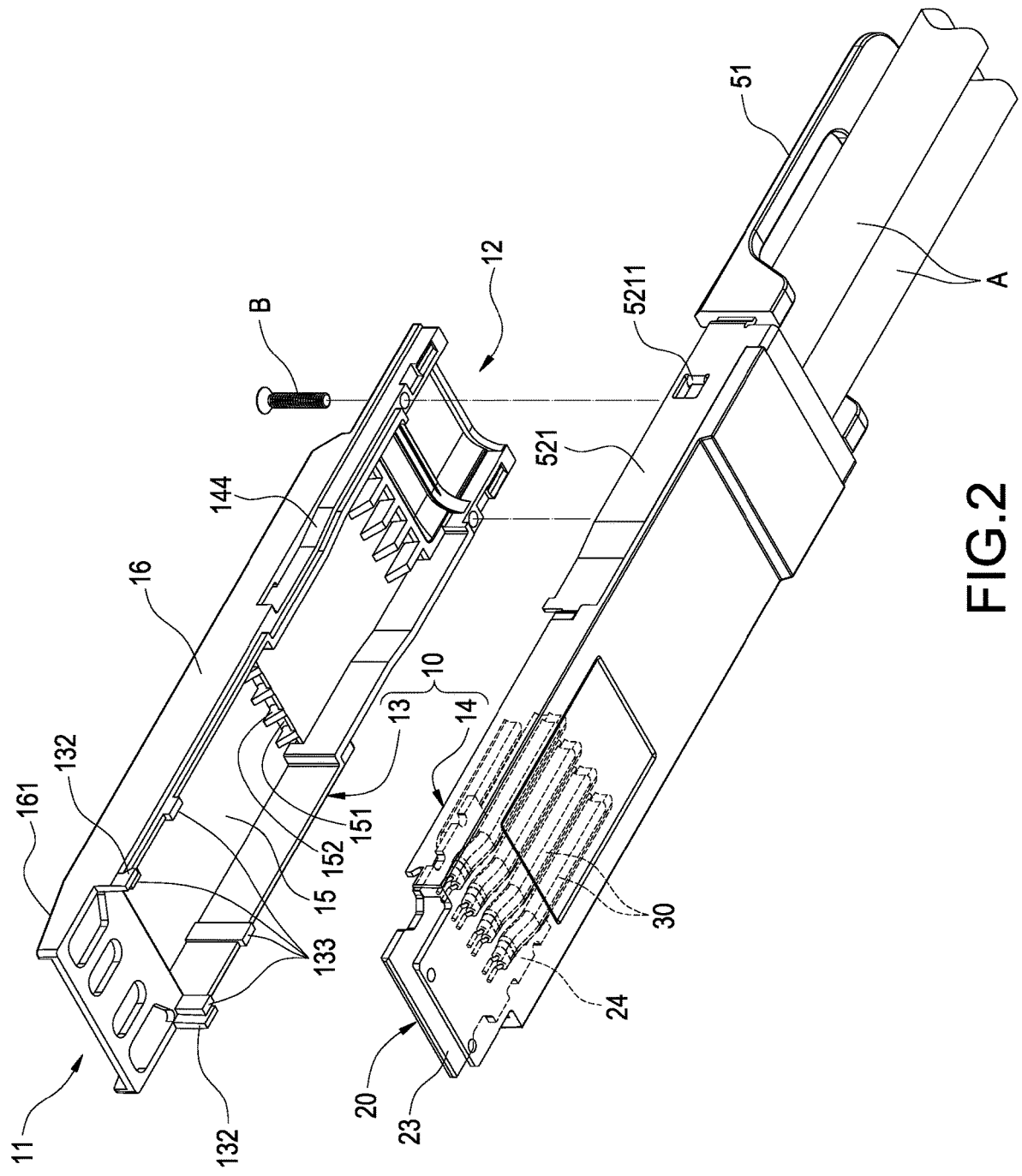
FIG. 2 is a perspective exploded view an upper shell of the present disclosure.
Figure 3:
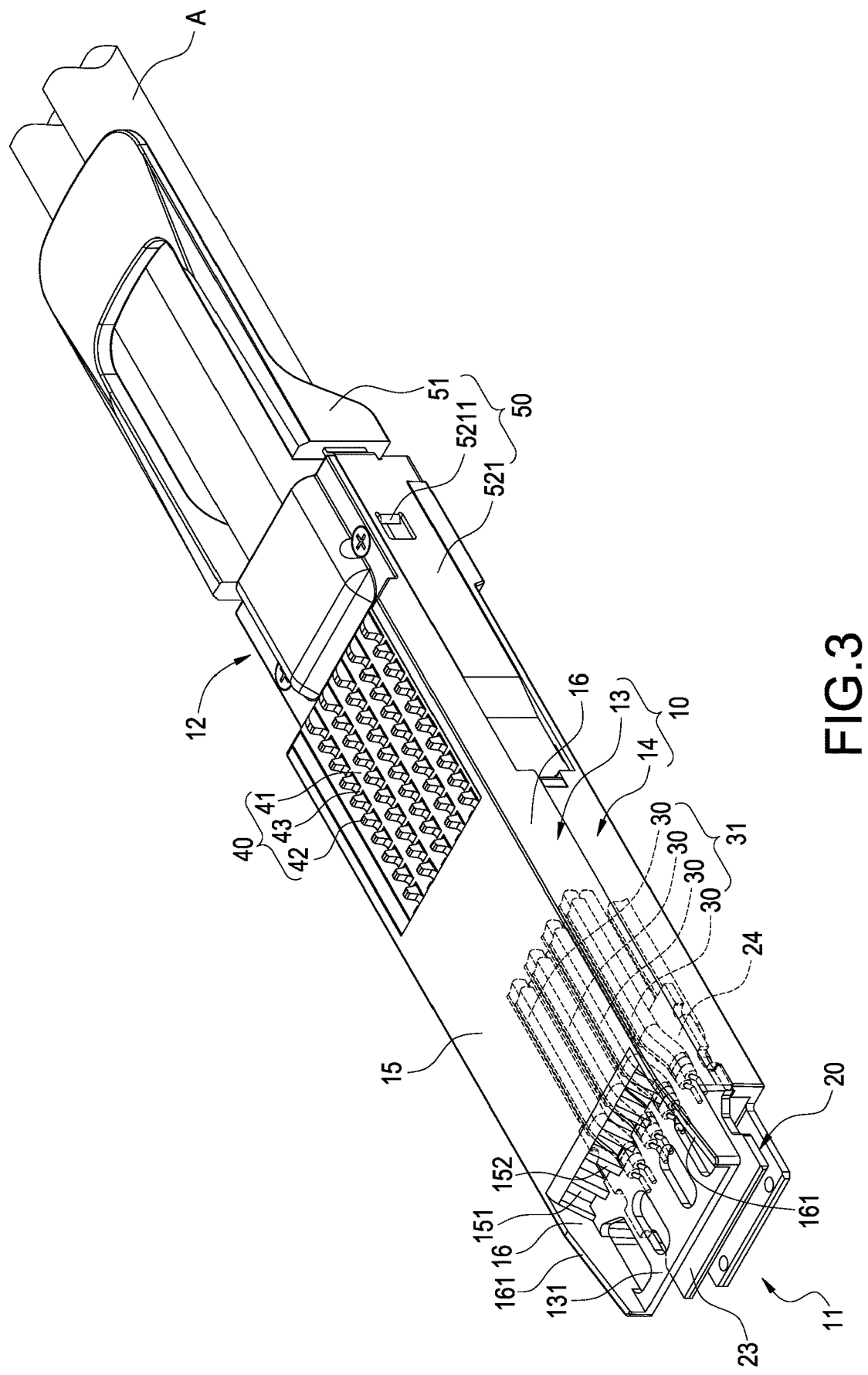
FIG. 3 is the perspective appearance diagram of the present disclosure.
Figure 4:
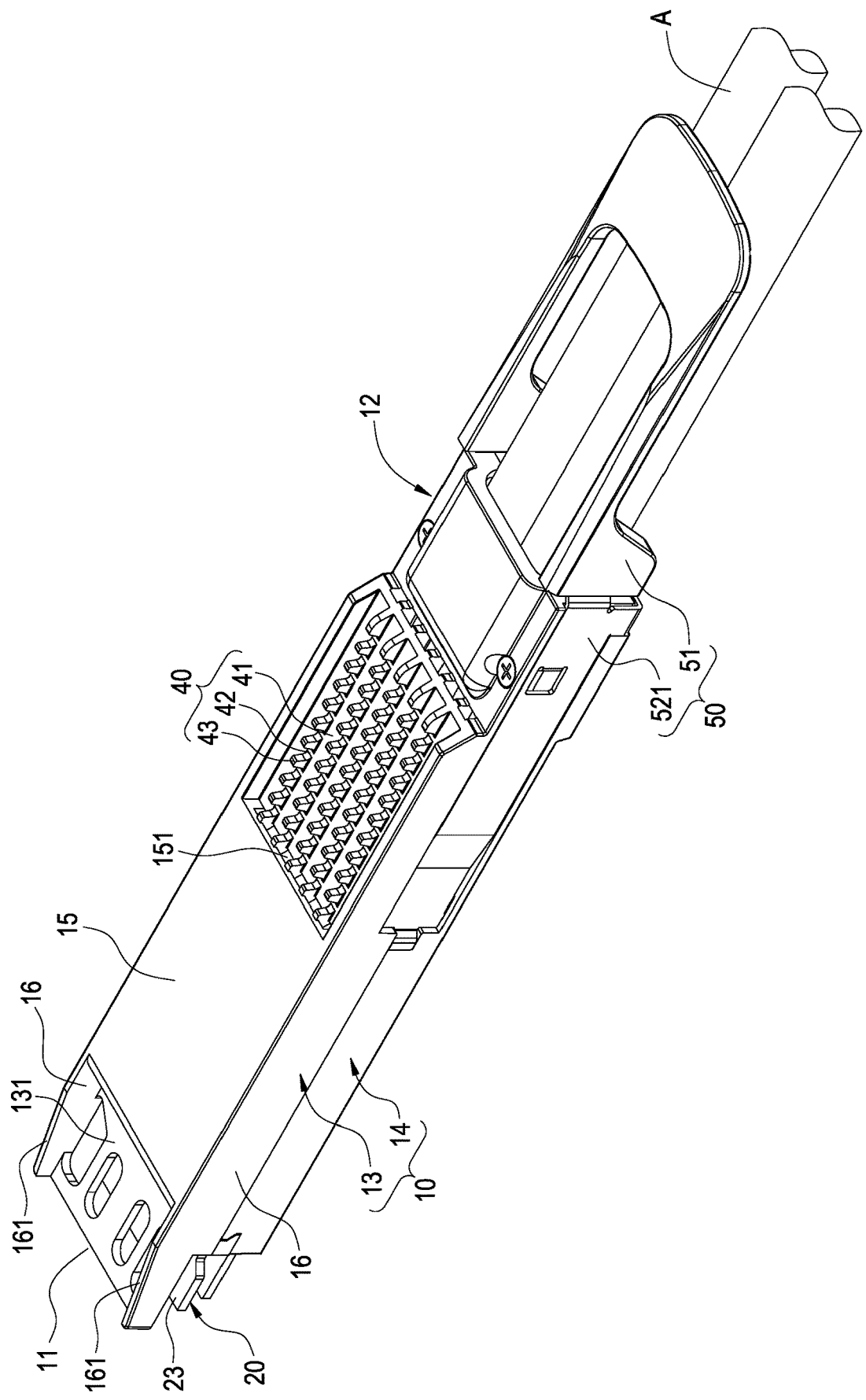
FIG. 4 is another view angle of the perspective exploded diagram of the present disclosure.
Figure 5:
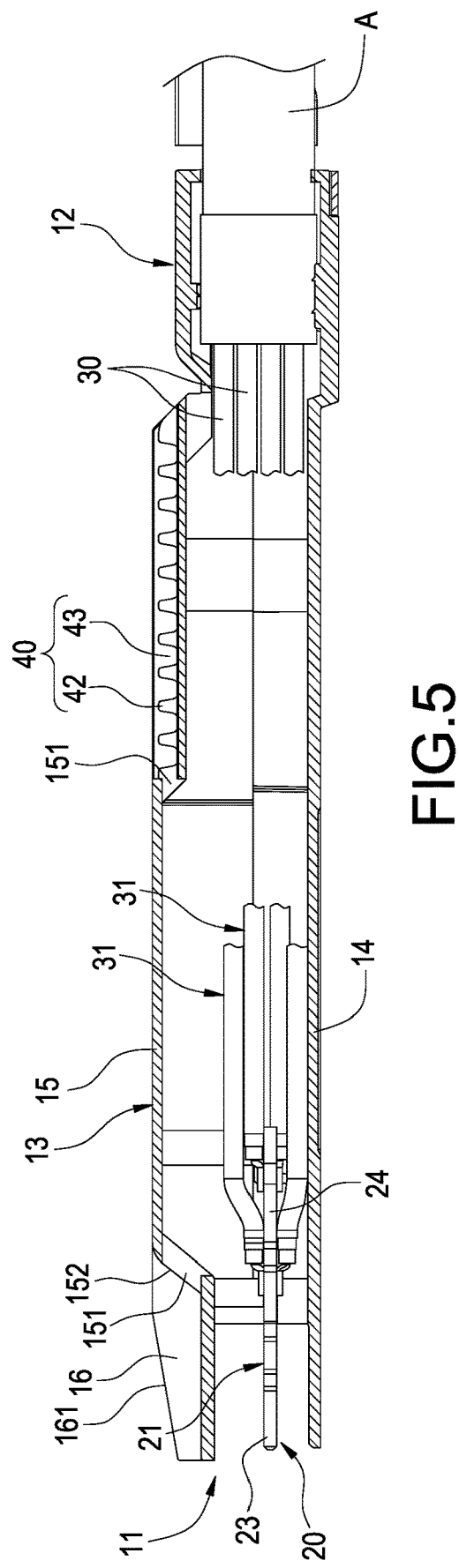
FIG. 5 is a cross-sectional side view of the present disclosure.

The technical content and detailed description of the present disclosure are now described with the drawings as follows. The present disclosure is not limited thereof.

Please refer to FIG. 1 to FIG. 5. the present disclosure provides a cable connector structure, which includes a housing 10, a tongue plate 20, a plurality of cables 30, and a plurality of heat sinks 40.

The housing 10 is a metal member with desired thermal conductivity such as aluminum or aluminum alloy, which is generally a hollow elongated body, and includes a docking end 11 and a butting end 12. A longitudinal direction of the housing 10 extends along a line connecting the docking end 11 and the butting end 12, and a transverse direction of the housing 10 is perpendicular to the longitudinal direction of the housing 10. The docking end 11 is used to plug in a mating docking connector (not shown), and the butting end 12 is used to electrically connect at least one wire harness A. In the present embodiment, a cross section of the housing 10 is generally rectangular and the housing 10 includes a top surface 131 connected between the docking end 11 and the butting end 12. A hollow stage (a raised portion with hollow internal space) 15 is protrudingly provided on the top surface 131 of the housing 10 corresponding to the docking end 11, and two ends of the hollow stage 15 are provided with a pair of through openings 151 facing the docking end 11 and the butting end 12 respectively. In the present embodiment, the housing 10 includes an upper shell 13 and a lower shell 14 that forms enclosure when combined with each other, and the upper shell 13 forms the top surface 131 of the housing 10. The upper shell 13 includes a pair of side walls 16 extending along the line connecting the docking end 11 and the butting end 12 and standing on two sides of the top surface 131. Each side wall 16 is truncated at the docking end 11 to form a guiding structure 161 in a shape of a bevel. The hollow stage 15 is located between the pair of side walls 16 and is connected to each side wall 16 respectively, and the top of the hollow stage 15 is preferably at the same height as the top edge of the two side walls 16 to greatly increase an internal space of the hollow stage 15. The cable connector structure of the present disclosure is placed horizontally when in use, with the lower shell 14 connected to a placement location and the top surface 131 facing upwards. Specifically, an interior of the hollow stage 15 is hollow, and each through opening 151 is connected to the interior of the housing 10. Therefore, the internal space of the housing 10 may perform a natural air convection with an external environment through the through openings 151. Each through opening 151 is provided with at least one rib 152 at intervals. In the present embodiment, preferably, a plurality of ribs 152 are provided. The plurality of ribs 152 are parallel to each other and supported in the through openings 151 to strengthen a structural strength of the hollow stage 15.

In the present embodiment, the upper shell 13 and the lower shell 14 are mainly fixed by two bolts B. Each bolt B passes through the upper shell 13 at the butting end 12 and is locked to the lower shell 14. The present disclosure is not limited thereof. For example, the upper shell 13 and the lower shell 14 may also be fixed by snapping or buckling (or embedding). The lower shell 14 is provided with a lower crook 141 on both sides of the docking end 11 respectively, and the upper shell 13 is provided with an upper crook 132 on both sides of the docking end 11 respectively. The upper crook 132 respectively hooks the lower crook 141 corresponded, and a fastening direction is the same as an extension direction of the housing 10. Therefore, the upper shell 13 and the lower shell 14 are fixed to prevent them from separating when pulled.

The tongue plate 20 is a strip-shaped circuit board and is arranged in the housing 10. One end of the tongue plate 20 is provided with a docking area 23. In the present embodiment, the docking area 23 is disposed at one end of the tongue plate 20, and the docking area 23 is exposed at the docking end 11 to be docked with the mating docking connector. A plurality of conductive wires may be printed on the docking area 23 as connecting fingers to electrically connect the tongue plate 20 to the mating docking connector. The other end of the tongue plate 20 is provided with a welding area 24, and a position of the welding area 24 corresponds to the hollow stage 15. One of the sides of the tongue plate 20 is a front surface 21, and the front surface 21 is arranged correspondingly to the hollow stage 15. That is, the front surface 21 of the tongue plate 20 faces the hollow stage 15. In the present embodiment, an edge of the tongue plate 20 is clamped between the upper shell 13 and the lower shell 14. Specifically, a plurality of support portions 22 are formed on both sides of the tongue plate 20, and the upper shell 13 and the lower shell 14 are convexly provided with a plurality of bumps 133 and 142. The supporting portions 22 of the tongue plate 20 are respectively attached to the bumps 142 of the lower shell 14 for support, and press the tongue plate 20 through the bumps 133 of the upper shell 13 to fix it.

Each cable 30 is wrapped in at least one wire harness A. Each cable 30 passes through the butting end 12 and penetrates into the housing 10 respectively, and is inserted into the housing 10 that is columnar. At least a part of the cables 30 is stacked on a surface of the tongue plate 20 corresponding to a position of the hollow stage 15. The hollow stage 15 provides extra space inside the housing 10 and allows more cable 30 to be connected to the tongue plate 20. In the present embodiment, at least a part of the cables 30 are respectively stacked on the front surface 21 of the tongue plate 20 and accommodated between the front surface 21 of the tongue plate 20 and the hollow stage 15. According to an allocation of space in housing 10, any remaining cable 30 may be connected to the other side of the tongue plate 20. The present disclosure is not limited thereto. All the cables 30 may also be connected to the front surface 21 of the tongue plate 20.

Figure 6:
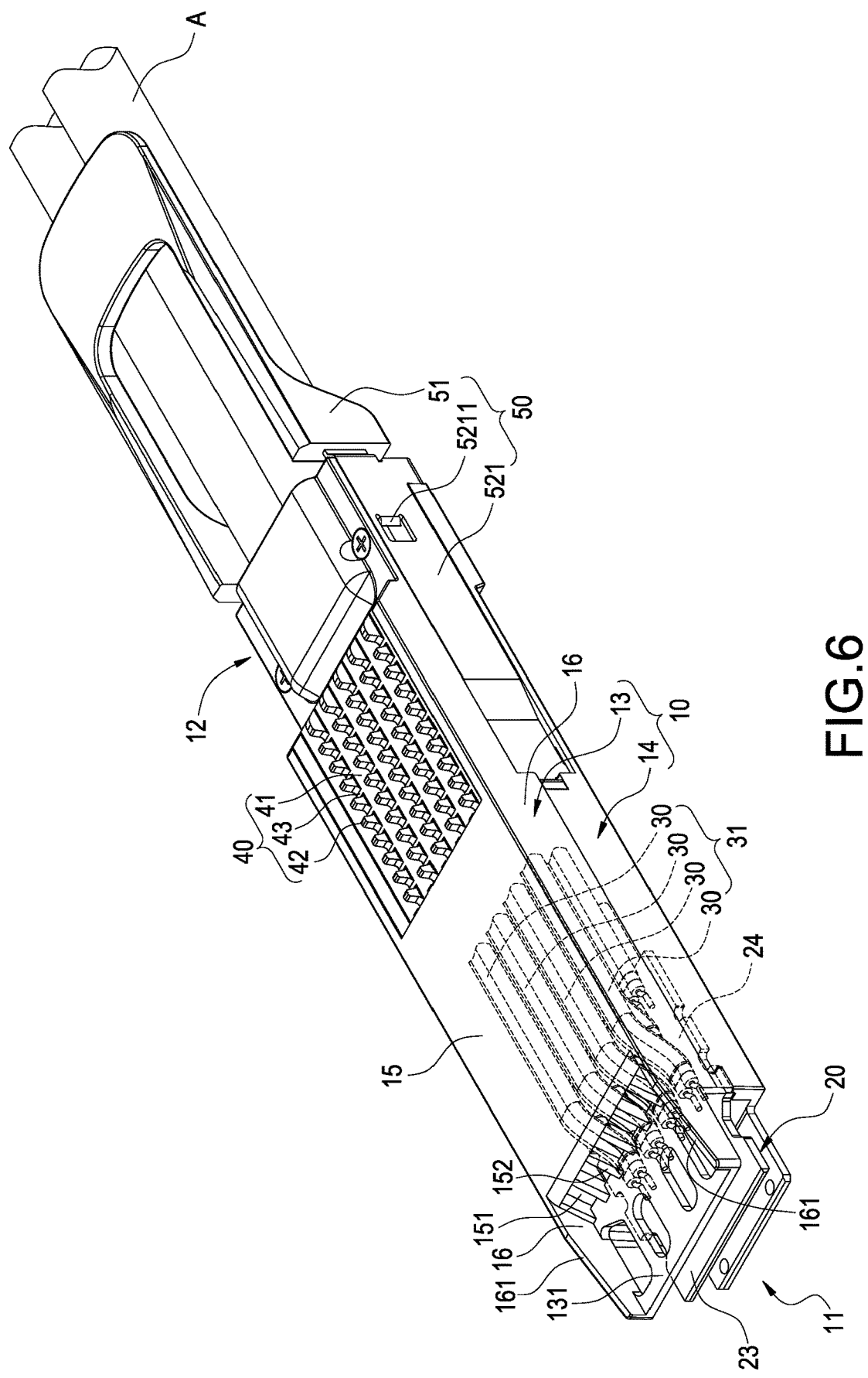
FIG. 6 is a perspective diagram of another embodiment of the present disclosure.
Figure 7:
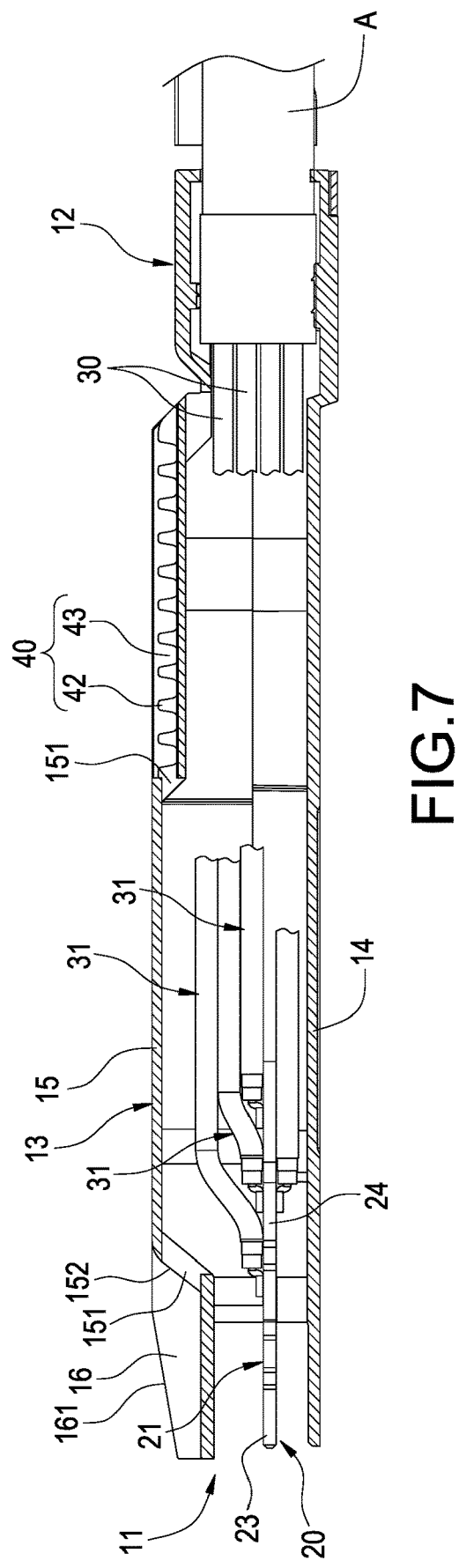
FIG. 7 is a cross-sectional side view of another embodiment of the present disclosure.

In the present embodiment, each cable 30 connected to the front surface 21 of the tongue plate 20 constitutes a plurality of line rows 31, and the end of each cable 30 in the plurality of line rows 31 is respectively connected to the front surface 21. The plurality of line rows 31 are stacked on top of each other to allow a connection between the line rows 31 and the front surface 21 to be parallel to the front surface 21, so that a space of the front surface 21 of the tongue plate 20 may be effectively used. In the present embodiment, a number of the line rows 31 on the front surface 21 of the tongue plate 20 is two. The present disclosure is not limited thereto. For example, a number of line rows 31 on the front surface 21 of the tongue plate 20 may also be three, four, or five . . . etc., depending on a design requirement. Please refer to FIG. 6 and FIG. 7, which show another embodiment of the present disclosure. A main difference is that the number of line rows 31 on the front surface 21 of the tongue plate 20 is three.

Figure 8:
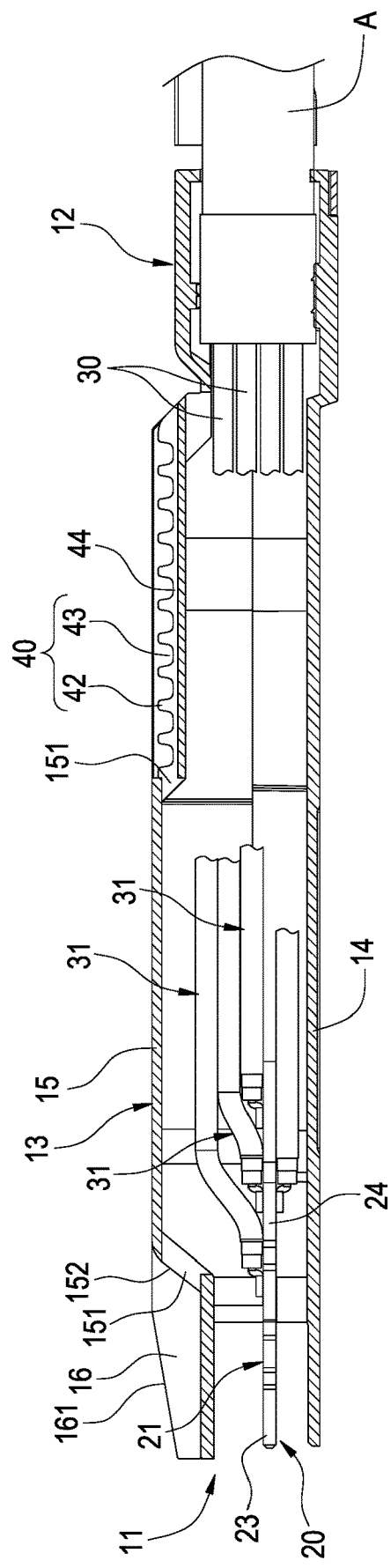
FIG. 8 is a schematic diagram of another aspect of heat sinks in the present disclosure.

Each heat sink 40 is integrally formed on (or in one-piece form with) the housing 10. The heat sinks 40 are arranged on the top surface 131 of the upper shell 13 in parallel and spaced apart and located at the butting end 12. That is, each heat sink 40 is arranged on a side of the hollow stage 15 away from the docking end 11. The plurality of heat sinks 40 are arranged parallel to each other, and the plurality of heat sinks 40 is surrounded and formed with a plurality of flow channels 41 extending parallel to a longitudinal direction of the housing 10. Thereby, a heat energy generated by the tongue plate 20 and each cable 30 during operation may be conducted upwards into the hollow stage 15, and the heat energy is taken away by the natural air convection through the two through openings 151 of the hollow stage 15. When the natural air convection flows through the flow channels 41, the heat sink 40 contacts the natural air convection to achieve the effect of cooling. The plurality of heat sinks 40 includes a plurality of rows with a plurality of protrusion 42 arranged in parallel. A plurality of recesses 43 are formed between each of the protrusions 42, and the plurality of protrusions 42 and the plurality of recesses 43 are continuously and alternately extended along a direction of a connection with the docking end 11 and the butting end 12. A height of the plurality of protrusions 42 is equal to or lower than a height of the two side walls 16, so that each of the protrusions 42 maintains a structure of the flow channel 41. At the same time, air flow is guided from the plurality of recesses 43 to different flow channels 41, so that each heat sink 40 uniforms thermal energy and improves heat dissipation efficiency. As shown in FIG. 8, each heat sink 40 may also reserve a root part 44 at a junction with the top surface, and the plurality of protrusions 42 and the plurality of recesses 43 are integrally formed on (or in one-piece form with) an upper edge of the root part 44.

Further, the cable connector of the present disclosure further includes an unlocking assembly 50 and a plurality of return springs 60. The unlocking assembly 50 may be a plastic part, which mainly includes a handle 51 and a locking member 52 connected to the handle 51. The handle 51 is of an inverted U-shape, and the locking member 52 includes at least one elastic arm 521. In the present embodiment, two elastic arms 521 with the same structure and functions are preferably configured, and the two elastic arms 521 are connected by a connecting arm 522. The two elastic arm 521 are respectively connected to the two ends of the handle 51 and used to release the cable connector. The housing 10 is provided with an actuating portion 144 on both sides of the butting end 12 corresponding to each elastic arm 521. In the present embodiment, each actuating portion 144 is preferably a slope surface. The present disclosure is not limited thereto. The actuating portion 144 may also be a protruding structure that may interfere with a movement stroke of the elastic arm 521 and push the elastic arm 521. As a result, when the handle 51 is pulled backward, the locking member 52 may be driven to move backward, and each elastic arm 521 is pushed against each actuating portion 144 so that each elastic arm 521 moves outward along a lateral direction of the housing 10. When the cable connector structure of the present disclosure is mated to the mating docking connector, the mating docking connector is locked by hooking into the cable connector structure with a structure such as a locking hook. Preferably, a hooking position corresponds to the elastic arm 521, so the mating docking connector is locked by the elastic arm 521. By moving the elastic arm 521 outwards, the mating docking connector is retracted and the cable connector structure is released.

The lower shell 14 is provided with a slot 143 on both sides of the butting end 12 corresponding to each elastic arms 521, and each slot 143 is provided with the return spring 60. Each elastic arms 521 includes a lug 5211 protruding toward the lower shell 14 corresponding to the return spring 60. The locking member 52 is socketed on the butting end 12 of the lower shell 14, and the handle 51 is located outside the butting end 12 and straddles the wire harness A. Specifically, the connecting arm 522 is located below the lower shell 14, and the two elastic arms 521 are attached to the left and right sides of the lower shell 14 and cover the slot 143. The lug 5211 of each elastic arms 521 is located in the slot 143, and the return spring 60 is clamped between the lug 5211 and the slot 143 by an elastic force of the return spring 60. When the handle 51 is pulled backwards, the locking member 52 is driven to move backwards. At the same time, the corresponding return spring 60 is pushed by each lug 5211 for compression. When the handle 51 is released, the unlocking assembly 50 is restored to its position through the elastic force of the return spring 60. In the present embodiment, the elastic arms 521, the return spring 60 and the slots 143 are arranged in pair and in mirrored manner. However, the present disclosure does not limit thereof.

In summary, the present disclosure is industrially applicable, and has novelty and inventive step. The present disclosure fully meets a requirement of a patent application, and an application is filed in accordance with the Patent Art. The present disclosure may also have various other embodiments. Without departing from a spirit and essence of the present disclosure, those skilled in the art may derive various corresponding changes and modifications according to the present disclosure. Any changes and modifications should be within the scope of the technical contents disclosed by the present disclosure without affecting effects and achievable effects of the present disclosure.

What is claimed is:

1. A cable connector structure comprising:
   a housing, comprising a docking end and a butting end, one side of the housing comprising a top surface, the housing comprising a hollow stage protrudingly provided on the top surface of the housing, the hollow stage comprising a pair of through openings facing the docking end and the butting end respectively;
   a tongue plate, arranged in the housing, one end of the tongue plate comprising a docking area, and the other end of the tongue plate comprising a welding area, wherein a position of the welding area corresponds to the hollow stage, and the docking area is exposed at the docking end;
   a plurality of cables, electrically connected to the welding area of the tongue plate; and
   a plurality of heat sinks, arranged on the top surface of the housing, wherein an arrangement of the hollow stage is biased towards the docking end, and an arrangement of the plurality of heat sinks is biased towards the butting end.

2. The cable connector structure in claim 1, wherein each of the through openings comprises at least one rib.

3. The cable connector structure in claim 1, further comprising a plurality of flow channels formed around the plurality of heat sinks, and the plurality of flow channels extend between the docking end and the butting end, and the plurality of flow channels communicate with an inside of the housing through one of the through openings.

4. The cable connector structure in claim 1, wherein at least part of the plurality of cables is stacked on a surface of the tongue plate corresponding to a position of the hollow stage.

5. The cable connector structure in claim 1, wherein the plurality of heat sinks comprises a plurality of protrusions and a plurality of recesses, and the plurality of protrusions and the plurality of recesses continuously and alternately extend along a direction of a connection with the docking end and the butting end.

6. The cable connector structure in claim 5, wherein each of the plurality of heat sinks comprises a root part at a junction of each of the plurality of heat sinks and the top surface, and the plurality of protrusions and the plurality of recesses are integrally formed on an upper edge of the root part.

7. The cable connector structure in claim 1, wherein the housing comprises an upper shell and a lower shell, and the upper shell and the lower shell are adapted to form an enclosed space when combined, and the tongue plate is clamped between the upper shell and the lower shell.

8. The cable connector structure in claim 7, wherein the upper shell comprises two side walls, each of the side walls comprises a guiding structure at the docking end respectively.

9. The cable connector structure in claim 8, wherein a height of a top of the hollow stage is same as a height of the side walls.

10. The cable connector structure in claim 8, wherein the plurality of heat sinks comprises a plurality of protrusions and a plurality of recesses, the plurality of protrusions and the plurality of recesses continuously and alternately extend along a direction of a connection with the docking end and the butting end, and a height of the plurality of protrusions is equal to or lower than a height of the side walls.

\* \* \* \* \*